United States Patent
Li et al.

(10) Patent No.: US 9,293,517 B2
(45) Date of Patent: Mar. 22, 2016

(54) ARRAY SUBSTRATE AND MANUFACTURING METHOD THEREOF, AND DISPLAY PANEL

(71) Applicant: BOE TECHNOLOGY GROUP CO., LTD., Beijing (CN)

(72) Inventors: Wenbo Li, Beijing (CN); Mi Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/550,173

(22) Filed: Nov. 21, 2014

(65) Prior Publication Data

US 2015/0340419 A1 Nov. 26, 2015

(30) Foreign Application Priority Data

May 26, 2014 (CN) .......................... 2014 1 0225652

(51) Int. Cl.
*H01L 25/16* (2006.01)
*H01L 21/78* (2006.01)
*H01L 23/498* (2006.01)
*H01L 31/12* (2006.01)
*H01L 27/32* (2006.01)
*G02F 1/1362* (2006.01)

(52) U.S. Cl.
CPC ...... *H01L 27/3276* (2013.01); *G02F 1/136227* (2013.01); *H01L 27/322* (2013.01); *H01L 27/3248* (2013.01)

(58) Field of Classification Search
CPC ............... H01L 2224/48091; H01L 2924/00; H01L 2224/73265; H01L 2224/48227; H01L 27/3276; H01L 2924/00012; H01L 2924/00014; H01L 2224/32145; H01L 2224/32225; H01L 27/124; H01L 51/56; H01L 27/12
USPC .......................................... 257/40, 72; 438/149
See application file for complete search history.

(56) References Cited

U.S. PATENT DOCUMENTS

| | | | |
|---|---|---|---|
| 2008/0174515 A1* | 7/2008 | Matthies | G02F 1/13336 345/1.3 |
| 2011/0181788 A1* | 7/2011 | Takatori | H04N 5/4401 348/725 |

* cited by examiner

*Primary Examiner* — Kimberly Rizkallah
*Assistant Examiner* — Brian Turner
(74) *Attorney, Agent, or Firm* — Nath, Goldberg & Meyer; Joshua B. Goldberg; Christopher Thomas

(57) ABSTRACT

The present invention provides an array substrate, a manufacturing method thereof and a display panel. The array substrate comprises a base, the base comprises a display region for displaying and a periphery region outside the display region, a plurality of lead wires extending from the display region to the periphery region are provided on a first side of the base, a plurality of conductive via-holes are provided in the periphery region of the base, the conductive via-holes are electrically connected with the respective lead wires and provided with conductive material therein, the lead wires are electrically connected to a second side of the base through the respective conductive via-holes; a back-side structure electrically connected with the conductive via-holes is provided on the second side of the base, and the back-side structure comprises a plurality of lead wire pads electrically connected with the respective conductive via-holes.

17 Claims, 3 Drawing Sheets

ARRAY SUBSTRATE AND MANUFACTURING METHOD THEREOF, AND DISPLAY PANEL

FIELD OF THE INVENTION

The present invention relates to the field of display technology, and particularly, to an array substrate and a manufacturing method thereof, and a display panel.

BACKGROUND OF THE INVENTION

An array substrate is an important member of a liquid crystal display panel, an organic light emitting diode (OLED) display panel and the like. The array substrate comprises a display region for displaying. Structures for displaying, such as gate lines, data lines, thin film transistors, and pixel electrodes (or organic light emitting diodes), are provided in the display region. In order to perform displaying, lead wires (gate lines, data lines, etc.) in the display region must be electrically connected with a driver integrated circuit (IC). There are various connection modes of the driver IC. For example, a tape carrier package (TCP) mode is that the driver IC is manufactured as a package tape and the package tape is provided at a lateral part of the array substrate; a chip on board (COB) mode is that the driver IC is provided on a printed circuit board (PCB) and the PCB is connected to a lateral part of the array substrate; a chip on film (COF) mode is that the driver IC is provided on a flexible printed circuit board (FPC) and the FPC is connected to a lateral part of the array substrate; and a chip on glass (COG) mode is that the driver IC is directly provided on the array substrate.

In order to avoid influence on displaying, the driver IC, the printed circuit board and the like cannot be directly connected to the lead wires in the display region. Thus, as shown in FIGS. 1 and 2, a periphery region 91 is provided outside a display region 92 on a base 11 of an array substrate 1, and lead wires 2 extend from the display region 92 to the periphery region 91 so as to connect with a driver IC (or a printed circuit board, etc.) 82. Generally, after entering into the periphery region 91 from the display region 92, the lead wires 2 first fan out, that is, the lead wires 2 gradually concentrate to have pitches which are matched with pitches of ports of the driver IC 82, and pads 3 for connecting with the driver IC 82, a printed circuit board and the like are provided at ends of the fan-out lead wires 2.

The inventor founds that there are following technical problems in the prior art.

First, the lead wires 2 complete fanning out in the periphery region 91, and structures such as pads 3 are also provided in the periphery region 91, thus width of the periphery region 91 must be large enough, but the periphery region 91 further needs to be packaged by a frame, resulting that dimension of the frame of the display panel is too large, and it is difficult to realize a narrow frame.

Moreover, as shown in FIG. 2, a certain space above the pads 3 should be reserved for connecting the driver IC 82, a printed circuit board and the like, thus a substrate (for example, a color filter substrate or a package substrate) 81 for aligning with the array substrate 1 to form a cell cannot cover the region where the pads 3 are provided, and the substrate 81 must be smaller than the array substrate 1. Dimensions of the substrate 81 and the array substrate 1 are different from each other, which results that cutting for the substrate 81 and cutting for the array substrate 1 must be performed separately, and the cutting process is complex.

In addition, when a plurality of display panels are spliced for use (i.e., when a plurality of display panels are used for consisting a large screen), since edges of the substrate 81 and the array substrate 1 are not aligned with each other, a frame should be provided outside thereof so as to splice, which leads to a complex structure and too large gaps between adjacent display panels, thus effect of splicing is poor.

SUMMARY OF THE INVENTION

In view of a problem that a large periphery region of an array substrate in the art leads to a too large frame, the present invention provides an array substrate and a manufacturing method thereof and a display panel comprising the array substrate to facilitate realization of a narrow frame.

One technical solution of the present invention is an array substrate comprising a base, and the base comprises a display region for displaying and a periphery region outside the display region, wherein a plurality of lead wires extending from the display region to the periphery region are provided on a first side of the base, a plurality of conductive via-holes are provided in the periphery region of the base, the conductive via-holes are electrically connected with the respective lead wires and provided with conductive material therein, the lead wires are electrically connected to a second side of the base through the respective conductive via-holes, a back-side structure electrically connected with the conductive via-holes is provided on the second side of the base, and the back-side structure comprises a plurality of lead wire pads electrically connected with the respective conductive via-holes.

Preferably, each of the conductive via-holes has a diameter between 5 μm to 100 μm, and a center-to-center pitch between adjacent conductive via-holes is between 10 μm and 80 μm.

Preferably, the conductive material is any one of copper, silver and chrome, or alloy thereof.

Preferably, the back-side structure further comprises a plurality of back-side lead wires respectively connected between the conductive via-holes and the lead wire pads.

Preferably, the back-side structure further comprises a driver IC connected with the lead wire pads.

Preferably, the array substrate is a liquid crystal display array substrate or a bottom emission type organic light emitting diode display array substrate, the back-side structure is provided in the periphery region.

Preferably, the array substrate is a top emission type organic light emitting diode display array substrate, the back-side structure is at least partially provided in the display region.

Preferably, the lead wires comprise gate lines and/or data lines.

Another technical solution of the present invention is a manufacturing method of an array substrate, the array substrate comprises a base, and the base comprises a display region for displaying and a periphery region outside the display region, wherein a plurality of lead wires extending from the display region to the periphery region are provided on a first side of the base, the manufacturing method comprises: step S11 of forming a plurality of via-holes in the periphery region of the base; step S12 of forming conductive material in each of the via-holes to form conductive via-holes, wherein, the conductive via-holes are electrically connected with the respective lead wires, and the lead wires are electrically connected to a second side of the base through the respective conductive via-holes, a back-side structure electrically connected with the conductive via-holes is provided on the second side of the base, and the back-side structure comprises a plurality of lead wire pads electrically connected with the respective conductive via-holes.

Preferably, the step S11 comprises: forming a plurality of via-holes in the periphery region of the base by a laser drilling process.

Preferably, the step S12 comprises: step S121 of vapor depositing conductive material on a side of the base to form a conductive material layer; step S122 of vapor depositing conductive material on another side of the base to form a conductive material layer while depositing conductive material in the via-holes; step S123 of forming a plurality of conductive patterns electrically connected with the respective conductive via-holes on the first side of the base by using the conductive material layer thereon through a patterning process, and forming a plurality of conductive patterns electrically connected with the respective conductive via-holes on the second side of the base by using the conductive material layer thereon through a patterning process.

Further preferably, in the step S123, the conductive patterns formed on the second side of the base comprise lead wire pads.

Further preferably, after the step S122, the step S12 further comprises: thickening the conductive material layers by an electroplating process.

Preferably, after the step S12, the manufacturing method further comprises: forming a display structure comprising lead wires on the first side of the base by a patterning process, wherein the lead wires are electrically connected with the conductive via-holes.

Preferably, before the step S11, the manufacturing method further comprises: forming a display structure comprising lead wires on the first side of the base by a patterning process, wherein the lead wires are electrically connected with the conductive via-holes.

Still another technical solution of the present invention is a display panel comprising the above array substrate.

Preferably, the display panel further comprises: a substrate for aligning with the array substrate to form a cell, edges of the substrate for aligning with the array substrate to form a cell and edges of the array substrate are aligned with each other.

Preferably, the substrate for aligning with the array substrate to form a cell is a color filter substrate or a package substrate.

Since the conductive via-holes are provided in the periphery region of the array substrate of the present invention, structures such as lead wire pads can be provided on back side of the base of the array substrate, and a width of the periphery region can be reduced so as to facilitate realization of a narrow frame. Meanwhile, since the lead wire pads are provided on the back side of the base, the substrate for aligning with the array substrate to form a cell will not influence on connections of the driver IC and the like, and dimensions of the substrate for aligning with the array substrate to form a cell and the array substrate can be equivalent to each other, thus the substrate for aligning with the array substrate to form a cell and the array substrate can be synchronously cut, and the display panels are easy to be spliced for use.

DETAILED DESCRIPTION OF EMBODIMENTS

Figure 1:
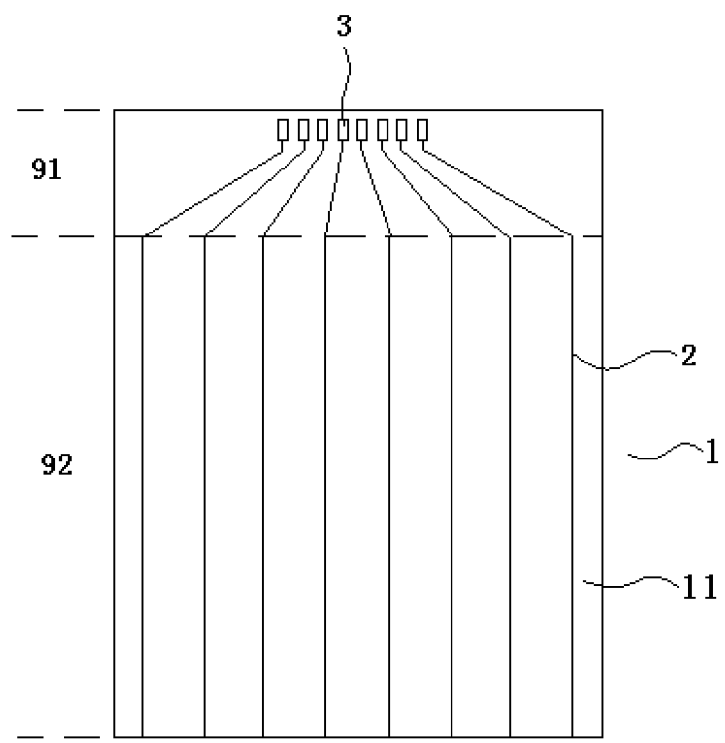
FIG. 1 shows a front view diagram of a structure of an array substrate in the prior art.
Figure 2:
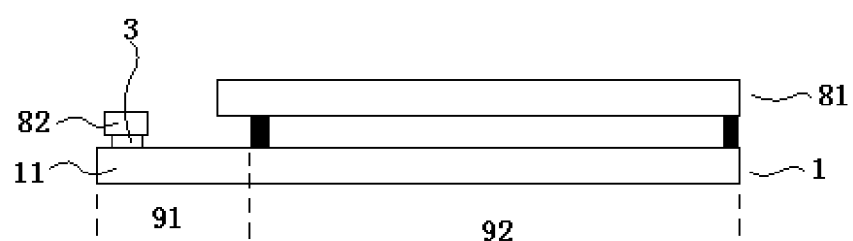
FIG. 2 shows a cross-sectional diagram of the structure of the array substrate in the prior art.

Hereinafter, the present invention will be described in detail in conjunction with accompanying drawings and specific embodiments so that persons skilled in the art can understand technical solutions of the present invention better.

First Embodiment

As shown in FIGS. 3 to 6, the present embodiment provides an array substrate 1 and a manufacturing method thereof, wherein, the array substrate 1 comprises a base 11, and the base 11 is generally made of glass and has a thickness between 0.3 mm and 0.5 mm.

The base 11 comprises a display region 92 for displaying and a periphery region 91 outside the display region 92. A display structure for displaying is provided in the display region 92 on a first side (i.e., the side close to the substrate 81 after the array substrate 1 being aligned with the substrate 81 to form a display panel, hereafter referred to as a front side) of the base 11. The display structure comprises lead wires 2, thin film transistors, pixel electrodes (or organic light emitting diodes) etc., and the specific configuration thereof is varied according to types of the array substrate 1, which will not be described in detail here.

Preferably, the lead wires 2 comprise gate lines and/or data lines.

Of course, it should be understood that, as for a different type of display panel, other lead wires 2 may be comprised, which will not be described individually here.

Figure 3:
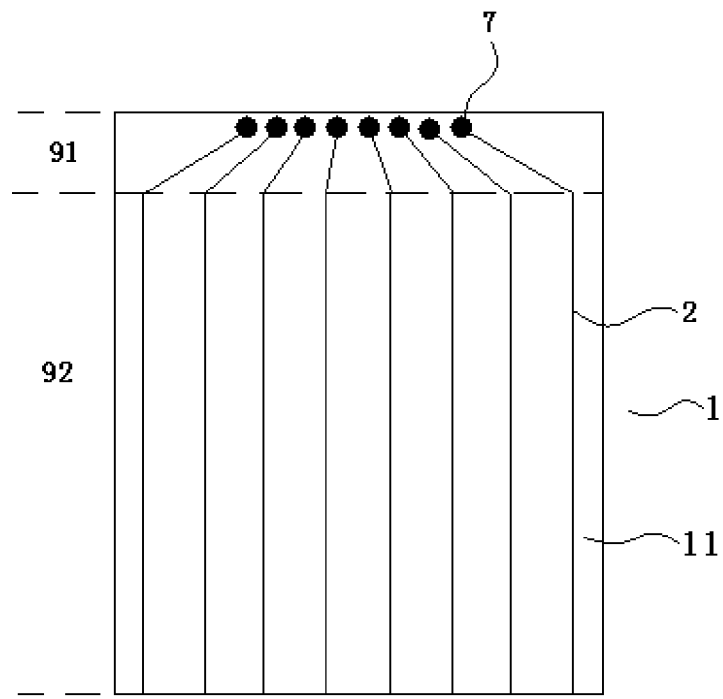
FIG. 3 shows a front view diagram of a structure of an array substrate according to a first embodiment of the present invention.

As shown in FIG. 3, on the front side of the base 11, a plurality of lead wires 2 extend from the display region 92 to the periphery region 91. In the present embodiment, as an example, the periphery region 91 is provided at only one side of the display region 92. However, it should be understood that, each side of the display region 92 may be provided with the periphery region 91.

Figure 4:
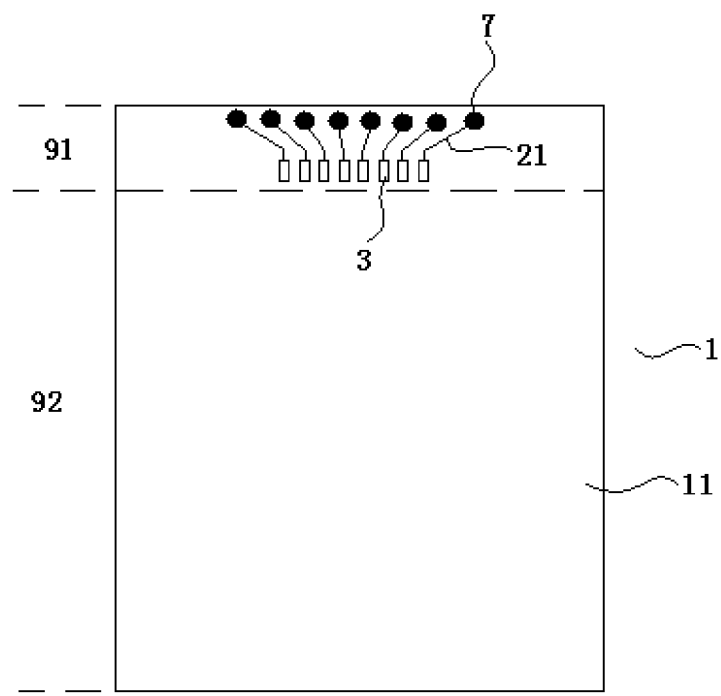
FIG. 4 shows a rear view diagram of the structure of the array substrate according to the first embodiment of the present invention.

In the present embodiment, as shown in FIG. 4, a plurality of conductive via-holes 7 electrically connected with the respective lead wires 2 are provided in the periphery region 91 of the base 11, each conductive via-hole 7 is provided with conductive material therein, the lead wires 2 are electrically connected to a second side (hereafter referred to as a back side, which is opposite to the front side) of the base 11 through the respective conductive via-holes 7. Meanwhile, a back-side structure electrically connected with the conductive via-holes 7 is provided on the back side of the base 11, and the back-side structure at least comprises a plurality of lead wire pads 3 electrically connected with the respective conductive via-holes 7.

That is to say, some via-holes penetrating through the base 11 are provided in the periphery region 91 of the array substrate 1 of the present embodiment, and each via-hole is provided with conductive material therein so that conductive via-holes 7 are formed. Meanwhile, the conductive via-holes 7 are electrically connected with the respective lead wires 2 on the front side of the base 11, and the back-side structure electrically connected with the conductive via-holes 7 is provided on the back side of the base 11. Therefore, the lead wires 2 are electrically connected with the back-side structure on the back side of the base 11 through the conductive via-holes 7. The back-side structure comprises the plurality of lead wire pads 3 electrically connected with the respective conductive via-holes 7, thus as long as a driver IC 82 is electrically connected to the lead wire pads 3, signals from the driver IC 82 can be transferred to the lead wires 2 in the display region 92 to achieve a display driving.

Figure 6:
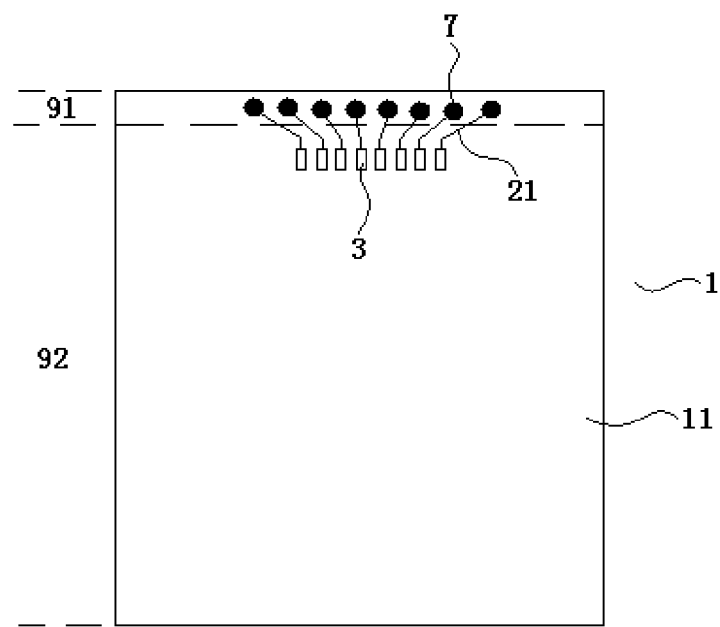
FIG. 6 shows a rear view diagram of a structure of another array substrate according to the first embodiment of the present invention.

As shown in FIGS. 3 and 4, in the array substrate 1 of the present embodiment, the lead wire pads 3 are provided on the back side of the base 11, thus in a direction perpendicular to the base 11, locations of the lead wire pads 3 may be coincident with that of other structures (such as lead wires 2) in the periphery region 91, even as shown in FIG. 6, the lead wire pads 3 may be directly provided in the display region 92 on the back side of the base 11, in this case, a width of the periphery region 91 required for the array substrate 1 of the present embodiment may be significantly reduced, which facilitates realization of a narrow frame design.

Figure 5:
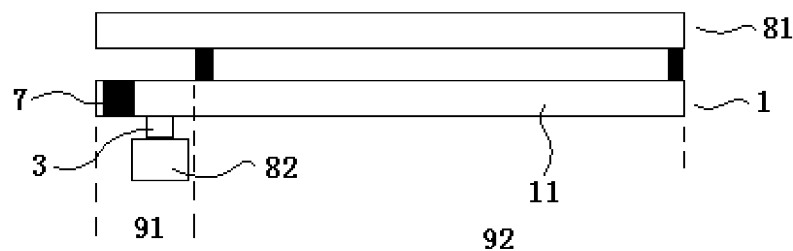
FIG. 5 shows a cross-sectional diagram of a structure of a display panel according to the first embodiment of the present invention.

Moreover, as shown in FIG. 5, since the lead wire pads 3 are provided on the back side of the base 11, the substrate 81 for aligning with the array substrate 1 to form a cell will not influence on connection between the lead wire pads 3 and the driver IC 82 and the like, thus dimensions of the substrate 81 and the array substrate 1 may be equivalent to each other, and the substrate 81 and the array substrate 1 may be synchronously cut, thereby simplifying the manufacturing process.

Meanwhile, since the dimensions of the substrate 81 and the array substrate 1 are equivalent to each other, while splicing display panels for use, edges of the display panels can be directly aligned with each other so that the display panels are spliced together for forming a lager screen, thus the structure of the large screen is simplified, pitches between adjacent display panels are small, and effect of splicing is good.

Preferably, each of the conductive via-holes 7 has a diameter between 5 μm and 100 μm, and a center-to-center pitch between adjacent conductive via-holes is between 10 μm and 80 μm.

The conductive via-holes 7 with the above dimensions can satisfy requirements for performances, and are easy to be realized by processes in the prior art.

Preferably, the conductive material is any one of copper, silver and chrome, or alloy thereof.

That is to say, metal materials such as copper, silver and chrome may be used as the conductive material, because these metal materials have advantages of high electrical conductivity, low cost, easy to be manufactured and so on.

The back-side structure at least comprises the lead wire pads 3, that is, the back side of the base 11 is at least provided with the lead wire pads 3 thereon, but obviously, the back-side structure is not limited thereto.

For example, preferably, as shown in FIGS. 4 and 6, the back-side structure further comprises a plurality of back-side lead wires 21 respectively connected between the conductive via-holes 7 and the lead wire pads 3.

As described above, the lead wires 2 from the display region 92 first fan out to reduce pitches therebetween, and then are connected to the driver IC 82. The fan-out lead wires 2 must occupy a certain space, which results that the width of the periphery region is increased. However, in the present embodiment, a portion of lead wires (back-side lead wires 21) can be provided on the back side of the base 11, thus a portion or entire of process for fanning out can be performed on the back side of the base 11, the fan-out lead wires may be consistent with other structures in the periphery region 91 on the front side of the base 11, and in some cases, the fan-out lead wires may be located in the display region 92, so that the width of the periphery region 91 can be further reduced.

Still for example, preferably, as shown in FIG. 5, the back-side structure further comprises a driver IC 82 connected with the lead wire pads 3.

As for the array substrate 1 in the chip on glass (COG) mode, the driver IC 82 is directly provided on the base 11 of the array substrate 1. Since the lead wire pads 3 are provided on the back side of the base 11, the driver IC 82 should be provided on the back side of the base 11 correspondingly.

In a word, the back-side structure has various specific forms, and all known structures in various package regions, such as the lead wire pads 3, the lead wires, the driver IC 82 etc., may be provided on the back side of the base 11 as a back-side structure.

As shown in FIGS. 4 and 5, for example, the array substrate 1 may be a liquid crystal display array substrate or a bottom emission type organic light emitting diode display array substrate, the back-side structure is provided in the periphery region 91.

As for the liquid crystal display array substrate, light should be transmitted through the display region 92, thus, in order to avoid influencing on displaying, the back-side structure described above cannot be provided in the display region 92 and can only be provided in the periphery region 91 on the back side of the base 11. Similarly, as for the bottom emission type organic light emitting diode display array substrate, light should be emitted from the back side thereof, thus the back-side structure described above also can only be provided in the periphery region 91.

In addition, as shown in FIG. 6, for example, the array substrate 1 may be a top emission type organic light emitting diode display array substrate, the back-side structure is at least partially provided in the display region 92 on the back side of the base 11.

It can be seen that, as for the top emission type organic light emitting diode display array substrate, since light should be emitted from the front side thereof, structures provided in the display region 92 on the back side of the base 11 will not influence on displaying, a portion of the back-side structure can be provided in the display region 92 so as to further reduce the dimension of the periphery region 91.

The present embodiment also provides a manufacturing method of an array substrate, the array substrate comprises a base, and the base comprises a display region for displaying and a periphery region outside the display region, wherein a plurality of lead wires extending from the display region to the periphery region are provided on a first side of the base, the manufacturing method comprises steps of: forming a plurality of via-holes in the periphery region 91 of the base 11; and forming conductive material in each of the via-holes to form conductive via-holes 7.

Specifically, the manufacturing method may comprise following steps S101 to S107.

S101: forming a plurality of via-holes in the periphery region 91 of the base 11 by a laser drilling process.

That is to say, certain positions in the periphery region 91 of the base 11 are irradiated by laser so that a plurality of via-holes are formed at these positions, wherein, positions at which there is no need to form via-holes may be shielded by a mask so that the laser only irradiates on the positions at which via-holes will be formed, or the certain positions may be directly irradiated by fine laser beams. Due to characteristics of the laser drilling process, each of the formed via-holes usually has a truncated cone shape, one end of which is slightly larger and the other end thereof is slightly smaller.

In the present embodiment, parameters for the laser drilling process preferably are that, a power density is between 100 w/cm$^2$ and 1000 w/cm$^2$, wavelength of the laser is 1064 nm, energy of a single pulse is between 20 J and 40 J, and frequency of pulses is between 1 Hz and 20 Hz.

S102: vapor depositing conductive material on a side (as an example, the front side) of the base 11, so as to form a conductive material layer.

That is to say, vapor deposition is performed on the front side of the base 11 facing toward a vapor deposition material source, so that a conductive material layer is formed on the front side of the base 11, wherein, the conductive material layer may be made of metals such as copper, silver and chrome or alloy thereof, and a preferable thickness is between 50 nm and 400 nm. Meanwhile, it should be understood that, at this time, the conductive material is also formed in the via-holes (for example, on sidewalls of the via-holes).

It should be understood that, since the conductive material layer is mainly used for forming the conductive via-holes 7, other portions such as the display region 92 on the base 11 are preferably shielded by a mask when the vapor deposition is performed, and the conductive material layer is only formed in and around the via-holes.

S103: vapor depositing conductive material on the other side (for example, the back side) of the base 11 to form a conductive material layer, and the conductive material is also deposited in the via-holes.

That is to say, the base 11 is reversed so as to perform vapor deposition on the back side thereof, thus a conductive material layer is also formed on the back side of the base 11, and the thickness of the conductive material layer is between 50 nm and 400 nm. Meanwhile, it should be understood that, the conductive material is also deposited in the via-holes (for example, on sidewalls of the via-holes).

S104: preferably, thickening the conductive material layers by an electroplating process.

Generally, a deposition speed of the vapor deposition process is slow, thus a long time will be taken to directly form a layer with a required thickness by the vapor deposition process. Therefore, preferably, a thin conductive material layer may be first formed by the vapor deposition process, and then the thin conductive material layer is thickened to have a required thickness by a conventional electroplating process. Meanwhile, the conductive material layer on the sidewalls of the via-holes may be thickened so that the conductive via-holes 7 are formed.

The thickness of the thickened conductive material layer is preferably between 1 μm and 10 μm. Specific parameters for the electroplating process are known, and will not be described in detail here.

S105: forming a plurality of conductive patterns electrically connected with the respective conductive via-holes 7 on the front side of the base 11 by using the conductive material layer thereon through a patterning process, and forming a plurality of conductive patterns electrically connected with the respective conductive via-holes 7 on the back side of the base 11 by using the conductive material layer thereon through a patterning process.

In the present embodiment, the "patterning process" refers to a process by which a portion of a material layer is removed so that the remaining portion of the material layer is formed as a required structure, and it specifically comprises one or more steps of applying photoresist, exposure, developing, etching, stripping off the photoresist, and so on.

It can be seen that, complete conductive material layers are obtained by the vapor deposition (or electroplating) processes, but the conductive via-holes 7 in the array substrate 1 should be respectively connected to different lead wires 2, and the lead wires 2 should be insulated from each other. Therefore, unnecessary portions of the conductive material layers are required to be removed by a patterning process so that the remaining conductive patterns are separated from each other and are respectively connected with the conductive via-holes 7.

In the present embodiment, each of the conductive patterns may be only a piece of metal layer around the via-holes, and is used for connecting with other structures such as the lead wires 2.

However, preferably, the conductive patterns formed on the back side of the base 11 comprise lead wire pads 3 (and may further comprise back-side lead wires 21).

That is to say, since the back-side structure on the back side of the base 11 must comprise the lead wire pads 3, the lead wire pads 3 may be directly formed by using the conductive material layers described above, in this manner, there is no need to separately manufacture the lead wire pads 3, and the manufacturing process can be simplified.

S106: forming a display structure comprising lead wires 2 on the front side of the base 11 by a patterning process, wherein the lead wires 2 are electrically connected with the conductive via-holes 7.

That is to say, other conventional display structures such as lead wires (gate lines, data lines) 2, thin film transistors, pixel electrodes (or organic light emitting diodes) are continuously formed on the front side of the base 11 by conventional processes, wherein the lead wires 2 are respectively connected with the conductive patterns on the front side of the base 11, so that the lead wires 2 are electrically connected with the respective conductive via-holes 7.

Of course, it should be understood that, in this step, in order to avoid that the display structure is unexpectedly connected with the conductive patterns, an insulating layer may be formed on the conductive patterns if necessary. For example, an insulating layer may be formed on the conductive patterns for connecting with data lines, then gate lines are manufactured, and ends of the gate lines are directly connected with the conductive patterns (there is no insulating layer thereon) for connecting with the gate lines, and then, before manufacturing the data lines, via-holes are first formed in the insulating layer (there may be also provided a gate insulating layer, etc.) on the conductive patterns for connecting with the data lines, so that the data lines can be connected with the conductive patterns.

In S107, preferably, if the back-side structure further comprises other structures such as the driver IC 82, operations of connecting the driver IC 82 are continuously performed, so that the array substrate 1 with complete functions is obtained.

Of course, it should be understood that, the embodiment described above may be modified in various known manners. For example, the via-holes described above may be formed by a corrosion manner, a mechanical manner or other manners. Further, the conductive material in the conductive via-holes may be formed by sputtering, plasma enhanced chemical vapor depositing, providing metal columns, chemical plating or other processes. If the thickness of the conductive material layer formed by depositing is appropriate, the electroplating process described above can be omitted. In addition, the conductive patterns on the front side of the base may be directly used for forming lead wires and the like in the display region. In a word, regardless of the specific manufacturing order, the processes, and the parameters, as long as the step of forming conductive via-holes in the periphery region is comprised, it falls within the protection scope of the present invention.

Second Embodiment

The present embodiment provides a manufacturing method of an array substrate, the array substrate comprises a base, and the base comprises a display region for displaying and a periphery region outside the display region, a plurality of lead wires extending from the display region to the periphery region are provided on a first side of the base, the manufacturing method comprises following steps S201 to S204.

S201: forming a display structure comprising lead wires on a front side of the base by a patterning process.

That is to say, conventional display structures such as lead wires (gate lines, data lines), thin film transistors, pixel electrodes (or organic light emitting diodes) are formed on the front side of the base by conventional processes.

In S202, a plurality of via-holes are formed in the periphery region of the base.

That is to say, a plurality of via-holes are formed in the periphery region of the base by a laser drilling process or other processes, the via-holes may penetrate through the lead wires described above.

S203: forming conductive material in each of the via-holes so that each of the via-holes becomes a conductive via-hole.

That is to say, the conductive material is formed in each of the via-holes by a vapor deposition process, an electroplating process or other processes, so that each of the via-holes becomes a conductive via-hole, and the conductive via-holes are electrically connected with the respective lead wires.

S204: preferably, continuously forming back-side structures such as lead wire pads and driver IC on the back side of the base.

It can be seen that, the distinctness of the present embodiment from the first embodiment is that, in the present embodiment, the conventional display structure comprising lead wires is first formed, then the conductive via-holes are formed, and the conductive via-holes are electrically connected with the respective lead wires corresponding thereto, an array substrate as described in the first embodiment can also be obtained.

Third Embodiment

As shown in FIG. 5, the present embodiment provides a display panel comprising the array substrate 1 described above.

Preferably, the display panel of the present embodiment further comprises a substrate 81 for aligning with the array substrate 1 to form a cell, and edges of the substrate 81 and the array substrate 1 are aligned with each other. The substrate 81 may be a color filter substrate or a package substrate.

That is to say, the display panel of the present embodiment preferably comprises two substrates for aligning with each other to form a cell, wherein one substrate is the array substrate 1 described above, and the other substrate may be a color substrate provided with a color filter film or a package substrate for packaging the organic light emitting diodes on the array substrate 1. As described above, the lead wire pads 3 on the array substrate 1 of the display panel in the present embodiment are provided on the back side of the base 11, thus dimensions of the substrate 81 and the array substrate 1 may be equivalent to each other, and edges of the substrate 81 and the array substrate 1 are aligned with each other, and therefore the substrate 81 and the array substrate 1 may be synchronously cut so that the manufacturing process is simplified, and the structure obtained by splicing is simple, and the effect of splicing is good.

Meanwhile, in the display panel of the present embodiment, since the lead wire pads 3 are provided on the back side of the array substrate 1, the printed circuit board, the flexible printed circuit board, the package tape, etc. connected with the array substrate 1 should also be connected to the back side of the array substrate 1, accordingly, the specific positions thereof may be determined in accordance with requirements. For example, as for a top emission type organic light emitting diode display panel, the printed circuit board, the flexible printed circuit board, the package tape, etc. may be directly stacked on the back side of the display region 92 so as to further reduce the width of the frame of the display panel. However, as for a liquid crystal display panel or a bottom emission type organic light emitting diode display panel, the printed circuit board, the flexible printed circuit board, the package tape, etc. may be extended outward in parallel with the array substrate 1 and located in a groove in the frame, or may be provided in a direction perpendicular to the array substrate 1 to extend in a direction away from the back side of the array substrate 1.

Specifically, the display panel of the present embodiment may be a liquid crystal display panel, an electronic paper, an organic light emitting diode display panel, a mobile phone, a table PC, a television, a display, a notebook PC, a digital photo frame, a navigator, or any other product or member with display function.

It should be understood that, the above embodiments are only used to explain the principle of the present invention, but not to limit the present invention. A person skilled in the art can make various variations and modifications without departing from spirit and scope of the present invention, and the variations and the modifications are also considered to be within the protection scope of the present invention.

The invention claimed is:

1. An array substrate, comprising a base, and the base comprising a display region for displaying and a periphery region outside the display region, a plurality of lead wires extending from the display region to the periphery region being provided on a first side of the base, wherein,
a plurality of conductive via-holes are provided in the periphery region of the base, the conductive via-holes are electrically connected with the respective lead wires and provided with conductive material therein, the lead wires are electrically connected to a second side of the base through the respective conductive via-holes;
a back-side structure electrically connected with the conductive via-holes is provided on the second side of the base, and the back-side structure comprises a plurality of lead wire pads electrically connected with the respective conductive via holes; and wherein
the back-side structure further comprises a plurality of back-side lead wires respectively connected between the conductive via-holes and the lead wire pads.

2. The array substrate of claim 1, wherein,
each of the conductive via-holes has a diameter between 5 µm to 100 µm, and
a center-to-center pitch between adjacent conductive via-holes is between 10 µm and 80 µm.

3. The array substrate of claim 1, wherein,
the conductive material is any one of copper, silver and chrome, or alloy thereof.

4. The array substrate of claim 1, wherein,
the back-side structure further comprises a driver IC connected with the lead wire pads.

5. The array substrate of claim 1, wherein,
the array substrate is a liquid crystal display array substrate or a bottom emission type organic light emitting diode display array substrate,
the back-side structure is provided in the periphery region.

6. The array substrate of claim 1, wherein,
the array substrate is a top emission type organic light emitting diode display array substrate,
the back-side structure is at least partially provided in the display region.

7. The array substrate of claim 1, wherein,
the lead wires comprise gate lines and/or data lines.

8. A display panel, comprising the array substrate of claim 1.

9. The display panel of claim 8, further comprising:
a substrate for aligning with the array substrate to form a cell, wherein edges of the substrate for aligning with the array substrate to form a cell and edges of the array substrate are aligned with each other.

10. The display panel of claim 9, wherein,
the substrate for aligning with the array substrate to form a cell is a color filter substrate or a package substrate.

11. A manufacturing method of an array substrate, the array substrate comprising a base, and the base comprising a display region for displaying and a periphery region outside the display region, a plurality of lead wires extending from the display region to the periphery region being provided on a first side of the base, the manufacturing method comprising:
step S11 of forming a plurality of via-holes in the periphery region of the base;
step S12 of forming conductive material in each of the via-holes to form conductive via-holes, wherein,
the conductive via-holes are electrically connected with the respective lead wires, and the lead wires are electrically connected to a second side of the base through the respective conductive via-holes,
a back-side structure electrically connected with the conductive via-holes is provided on the second side of the base, and the back-side structure comprises a plurality of lead wire pads electrically connected with the respective conductive via-holes.

12. The manufacturing method of claim 11, wherein, the step S11 comprises:
forming a plurality of via-holes in the periphery region of the base by a laser drilling process.

13. The manufacturing method of claim 11, wherein, the step S12 comprises:
step S121 of vapor depositing conductive material on a side of the base to form a conductive material layer;
step S122 of vapor depositing conductive material on another side of the base to form a conductive material layer while depositing conductive material in the via-holes;
step S123 of forming a plurality of conductive patterns electrically connected with the respective conductive via-holes on the first side of the base by using the conductive material layer thereon through a patterning process, and forming a plurality of conductive patterns electrically connected with the respective conductive via-holes on the second side of the base by using the conductive material layer thereon through a patterning process.

14. The manufacturing method of claim 13, wherein,
in the step S123, the conductive patterns formed on the second side of the base comprise lead wire pads.

15. The manufacturing method of claim 13, wherein, after the step S122, the step S12 further comprises:
thickening the conductive material layers by an electroplating process.

16. The manufacturing method of claim 11, further comprising:
forming a display structure comprising lead wires on the first side of the base by a patterning process after the step S12, wherein,
the lead wires are electrically connected with the conductive via-holes.

17. The manufacturing method of claim 11, further comprising:
forming a display structure comprising lead wires on the first side of the base by a patterning process before the step S11, wherein,
the lead wires are electrically connected with the conductive via-holes.

* * * * *